US007157116B2

(12) United States Patent
Weinert

(10) Patent No.: US 7,157,116 B2
(45) Date of Patent: Jan. 2, 2007

(54) METHOD FOR THE PRODUCTION OF PLANE-PARALLEL PLATELETS BY USING ORGANIC SEPARATING AGENTS

(75) Inventor: Hilmar Weinert, Kaufbeuren (DE)

(73) Assignee: Ciba Specialty Chemicals Corporation, Tarrytown, NY (US)

( * ) Notice: Subject to any disclaimer, the term of this patent is extended or adjusted under 35 U.S.C. 154(b) by 355 days.

(21) Appl. No.: 10/478,190

(22) PCT Filed: May 21, 2002

(86) PCT No.: PCT/DE02/01858

§ 371 (c)(1),
(2), (4) Date: Nov. 18, 2003

(87) PCT Pub. No.: WO02/094945

PCT Pub. Date: Nov. 28, 2002

(65) Prior Publication Data

US 2004/0131776 A1    Jul. 8, 2004

(30) Foreign Application Priority Data

May 21, 2001   (DE)   ................................ 101 24 796
Oct. 15, 2001  (DE)   ................................ 101 50 562
Oct. 18, 2001  (DE)   ................................ 101 51 375

(51) Int. Cl.
C23C 14/00     (2006.01)
C23C 14/22     (2006.01)

(52) U.S. Cl. .................. 427/248.1; 427/250; 427/251; 427/255.6; 427/294; 427/331; 427/350; 427/255.7

(58) Field of Classification Search ..................... None
See application file for complete search history.

(56) References Cited

U.S. PATENT DOCUMENTS 6,270,840 B1    8/2001   Weinert ..................... 427/251

(Continued)

FOREIGN PATENT DOCUMENTS

CA          2366953       10/2000

(Continued)

Primary Examiner—Timothy Meeks
Assistant Examiner—Kelly Stouffer
(74) Attorney, Agent, or Firm—Joseph C. Suhadolnik

(57) ABSTRACT

A new method is proposed for the production of plane-parallel platelets, comprising the steps a) vapor-deposition, at a pressure below atmospheric pressure, of a separating agent onto a carrier to produce a separating agent layer, b) vapor-deposition, at a pressure below atmospheric pressure, of at least one product layer onto the separating agent layer, c) dissolution of the separating agent layer in a solvent and production of a suspension in which the at least one product layer is present in the form of plane-parallel platelets, in which method the separating agent is selected from the group consisting of anthracene, anthraquinone, acetamidophenol, acetylsalicylic acid, camphoric anhydride, benzimidazole, benzene-1,2,4-tricarboxylic acid, biphenyl-2,2-dicarboxylic acid, bis(4-hydroxyphenyl)-sulfone, dihydroxyanthraquinone, hydantoin, 3-hydroxybenzoic acid, 8-hydroxyquinoline-5-sulfonic acid monohydrate, 4-hydroxycoumarin, 7-hydroxycoumarin, 3-hydroxynaphthalene-2-carboxylic acid, isophthalic acid, 4,4-methylene-bis-3-hydroxynaphthalene-2-carboxylic acid, naphthalene-1,8-dicarboxylic anhydride, phthalimide and its potassium salt, phenol-phthalein, phenothiazine, saccharin and its salts, tetraphenylmethane, triphenylene, triphenylmethanol, and also mixtures of at least two of those substances. Separating agents that have been found to be especially suitable are aromatic compounds having at least one benzene ring. The present invention relates also to the use of the plane-parallel platelets thereby produced and also to the products obtainable using such methods.

13 Claims, 1 Drawing Sheet

Figure 1:
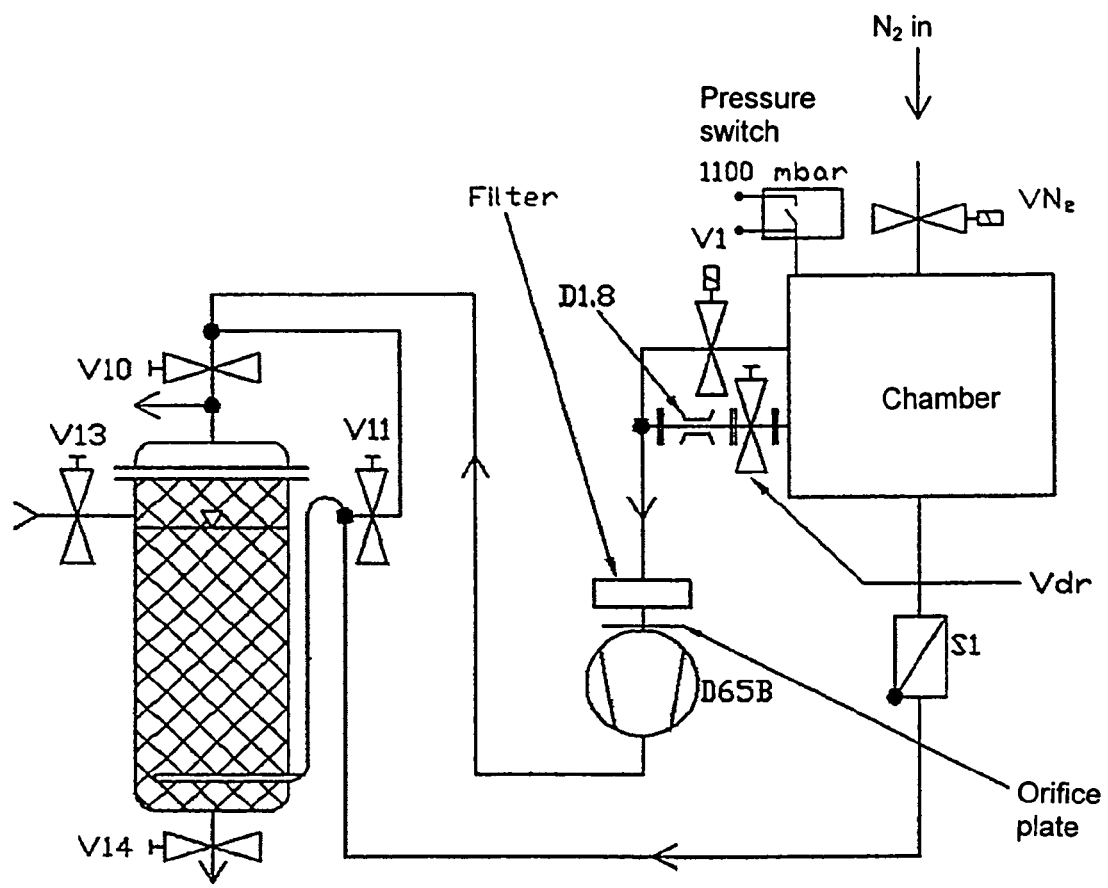

U.S. PATENT DOCUMENTS 6,398,999 B1 * 6/2002 Josephy et al. ............... 264/81

FOREIGN PATENT DOCUMENTS

| | | |
|---|---|---|
| DE | 19933230 | 10/2000 |
| EP | 0990715 | 4/2000 |
| WO | 00/24946 | 5/2000 |
| WO | 01/25500 | 4/2001 |

* cited by examiner

METHOD FOR THE PRODUCTION OF PLANE-PARALLEL PLATELETS BY USING ORGANIC SEPARATING AGENTS

The present invention relates to a method for the production of plane-parallel platelets, to the use of the plane-parallel platelets so produced and also to products obtainable using such methods.

There is great interest in plane-parallel platelets or "flakes", usually of aluminium or of combinations of metals with oxides, for use as pigments in surface-coating compositions and printing inks, as catalyst materials, as starting materials for magnetic and electrical screens and as starting materials for conductive surface-coating compositions. These products differ from conventional pigments, which are produced using a grinding procedure and which are spheres that have been flattened off to a greater or lesser extent and therefore have a substantially less favourable surface-to-weight ratio.

Such plane-parallel platelets are typically from 30 to 500 nm thick; the planar dimensions, that is to say the lengths of the edges, are typically from 5 to 50 µm.

The pigment content of a metallic automotive finish comprises about 80–100 g of aluminium in the case of conventional ground pigments whereas just 4–5 g suffice for the same area when plane-parallel platelets of aluminium produced by the PVD ("physical vapour deposition") method are used. Plane-parallel platelets are accordingly distinguished by greater economy. Just 3–4 layers of such platelets, used in weights of only from 0.3 to 0.4 g/m$^2$, produce a layer that provides optical coverage of the background.

In accordance with DE 198 44 357 C2 (Weinert), such plane-parallel platelets (flakes) are produced, in a continuous method, by vapour-deposition of a separating agent layer and a product layer, for example an aluminium layer, in succession, under the same high vacuum, onto an endless carrier whilst passing through, followed by dissolution of the separating agent in a subsequent bath of a solvent, which is likewise under vacuum. As a result, the product layer breaks up into individual flakes, which are then present in a suspension comprising the solvent, the dissolved separating agent and the flakes. The suspension is collected and the plane-parallel platelets are isolated using methods known per se and further processed to produce surface-coating compositions or printing inks.

A further, discontinuous multi-step method is used for the production of optically variable pigment platelets, such as are used for increasing the security of bank notes against forgery (EP 227 423). U.S. Pat. No. 5,278,590 describes a similar method. In U.S. Pat. No. 4,168,985 (Venis), U.S. Pat. No. 3,123,489 (Bolomey et al.) and U.S. Pat. No. 5,156,720 (Rosenfeld), the separating agents used are inorganic salts, which are dissolved in a subsequent step using water as solvent, as a result of which the product layer is present in the form of flakes in aqueous suspension.

According to WO 99/65618 (Kittler), waxy substances are vaporised and then, under the same vacuum, the product layer is vapour-deposited or sputtered. After a large number of revolutions of the carrier, usually a rotating cylinder, the arrangement of n layers (wax/metal) is scraped off. In a further step, outside the vacuum apparatus, the wax is washed out of the collected paste by means of solvent(s). In all cases, large amounts of solvent(s), which have to be either reprocessed or disposed of subsequently, are required in order to wash the product.

For the production of plane-parallel platelets of metals such as aluminium, iron, copper and titanium and of water-soluble compounds, salts are not suitable as separating agents. The large surface areas of such platelets react with the water, with formation of hydrogen, or the water-soluble compounds are simply dissolved. Moreover, the metal surfaces of such platelets are attacked by the chemical reaction and lose their surface quality. In the case of copper, the anion of the dissolved salt reacts with the metal.

In contrast, in the case of platelets of quartz or titanium dioxide produced by the PVD method, no reaction occurs; salts are suitable separating agents. Sodium chloride, sodium tetraborate (U.S. Pat. No. 3,123,489; Bolomey et al.) and also sodium fluoride (U.S. Pat. No. 4,168,985; Venis) and other salts are known as substances that can readily be vaporised and that do not undergo decomposition in the PVD method. They are, however, not suitable for use when the product layer is to be a metal and/or when water cannot be used as solvent.

Organic compounds that can be evaporated in vacuo substantially without undergoing decomposition would be indicated in such cases. From the literature there are known a number of publications according to which such organic substances can be vapour-deposited, in the form of transparent, electrically insulating layers, onto a carrier using the PVD method (see, for example, U.S. Pat. No. 3,379,803; Tittmann et al.).

In that case, polymer layers are produced by means of vaporisation of xylylene compounds. Those compounds form polymers known by the group designation parylenes after condensation, under the influence of high-energy electrons or short-wave ultraviolet light, on a carrier. The layers so obtained are not suitable as separating agent layers, the function of which is to dissolve rapidly in solvents. Such layers are rather, according to Römpp, Chemielexikon, Volume 4, page 3130, extremely resistant to solvents even at 400° C. and are used especially as so-called barrier layers in semi-conductor production.

Further examples of the vaporisability of organic substances for such layers by the PVD method are described in U.S. Pat. No. 6,101,316 (Nagashima et al.), DE-OS 2 706 392 (Ikeda et al.), DE-OS 2 009 080 (Davies et al.) and U.S. Pat. No. 3,547,683 (Williams, Hayes).

According to those publications, addition polymers and condensation polymers, silicone resins, phthalocyanine dyes and even natural materials such as colophony are vaporised. A further method by means of which organic polymer layers are produced using the PVD method is described in U.S. Pat. No. 5,440,446 (Shaw), wherein a liquid monomer is vaporised, condensed in wet form on a passing film carrier on a cooled roller and, on the same roller, immediately polymerised by electron beam bombardment, as a result of which a solid film forms. Subsequently, a metal layer, usually aluminium, is vapour-deposited.

U.S. Pat. No. 4,382,985 discloses the deposition of a polymer film onto a substrate by means of plasma polymerisation of fluoroalkyl acrylate monomers. From U.S. Pat. No. 5,904,958 it is known to deposit organic monomers on substrates by means of vacuum methods and subsequently to carry out polymerisation. From JP 11-140 626 A (Patent Abstracts of Japan) it is known to apply a thin film of triazine monomers to a substrate, for example by means of a vacuum method, and then to carry out polymerisation.

The aim of all those methods is to produce firmly adherent protective layers. Rapid solubility in solvents is not desired and would even be damaging.

Finally, DE 199 33 230 A1 and DE 199 35 181 A1 (Moosheimer et al.) disclose release layers or protective layers comprising organic monomers that are preferably water-soluble, especially triazine monomers. Such layers can be dissolved away using warm water, which is, however, not suitable for the method according to the invention because of its reactivity with the metals used according to the invention (evolution of $H_2$), because of its residual oxygen content (creeping oxidation) and because of the difficulty of removing it from the products.

The problem of the present invention was accordingly to make available a substantially improved method, compared to the above-mentioned prior art such as, for example, DE 198 44 357 C2 (Weinert), for the production of plane-parallel platelets by using the PVD method.

Suitable separating agents should be capable preferably of being used in a continuous PVD method and especially of being vaporised in an industrial context in amounts of more than 1 kg/h with little thermal decomposition. The amounts of non-condensable cracked gases that form should be substantially less than the capacities of the high-vacuum pumps customarily used for such methods.

The separating agents should be condensable in the form of an amorphous layer at from 0° to about 50° C., preferably at room temperature, on a moving carrier passing by continuously. They should react as little as possible with a product layer vapour-deposited in accordance with the invention onto the separating agent layer, which product layer comprises metals such as, for example, aluminium, iron, copper, silver, zinc, tin, titanium and also mixtures thereof, fluorides, such as magnesium fluoride, or sulfides, such as zinc sulfide, oxides, such as silicon dioxide and titanium dioxide, or with multi-layer systems comprising such substances.

The separating agent layer between the carrier and the product layer, from which the plane-parallel platelets are obtained, should be capable of dissolving as quickly as possible. Also, the solvent required for dissolution of the separating agent layer must not react chemically with the product layer, which then breaks up into fine flakes. The time available is determined by the maximum dwell time in the dissolution zone. In the case of industrial carrier speeds of from 50 to 250 m/min, this time is typically from 5 to 20 seconds, especially from 5 to 10 seconds.

The problem has been solved, surprisingly, by the method of the invention according to claim 1, the uses of the invention according to claims 11 to 14 and the product of the invention according to claim 15. The dependent claims relate to preferred embodiments.

The present invention accordingly relates to a method for the production of plane-parallel platelets, comprising the steps a) vapour-deposition, at a pressure below atmospheric pressure, of a separating agent onto a carrier to produce a separating agent layer, b) vapour-deposition, at a pressure below atmospheric pressure, of at least one product layer onto the separating agent layer, and c) dissolution of the separating agent layer in a solvent and production of a suspension in which the at least one product layer is present in the form of plane-parallel platelets, in which method the separating agent is selected from the group consisting of anthracene, anthraquinone, acetamidophenol, acetylsalicylic acid, camphoric anhydride, benzimidazole, benzene-1,2,4-tricarboxylic acid, biphenyl-2,2-dicarboxylic acid, bis(4-hydroxyphenyl)sulfone, dihydroxyanthraquinone, hydantoin, 3-hydroxybenzoic acid, 8-hydroxyquinoline-5-sulfonic acid monohydrate, 4-hydroxycoumarin, 7-hydroxycoumarin, 3-hydroxynaphthalene-2-carboxylic acid, isophthalic acid, 4,4-methylene-bis-3-hydroxy-naphthalene-2-carboxylic acid, naphthalene-1,8-dicarboxylic anhydride, phthalimide and its potassium salt, phenolphthalein, phenothiazine, saccharin and its salts, tetraphenylmethane, triphenylene, triphenylmethanol, and also mixtures of at least two of those substances.

The above-mentioned separating agents meet the following conditions:

They are solid, non-polymerisable organic compounds having vapour pressures of less than $10^{-3}$ Pa at 25° C. (fundamental requirement in order to be able to use a material without self-vaporisation at room temperature in a vacuum of <0.1 Pa).

The separating agent layer is rapidly soluble in industrial solvents such as, for example, isopropanol, ethyl acetate, butanol, ethanol, petroleum spirit, methyl isobutyl ketone, methyl ethyl ketone or perchloroethylene.

Below their melting points, the separating agents have vapour pressures of from 10 to 1000 Pa. As a result, use of the separating agents according to the invention results in sublimative vaporisation below the triple point of the substances and avoids technically disadvantageous spatter formation.

The separating agents have, moreover, high thermal stability and are available in industrial amounts for the planned implementation of a production process. They have an advantageous price ratio with respect to the metal or product from which the plane-parallel platelets are to be produced.

Especially suitable for carrying out the method according to the invention are those of the above-mentioned separating agents which have aromatic structural elements, preferably of the homocyclic type, in the molecule, especially aromatic compounds having at least one benzene ring.

In addition, these substances condense in amorphous form. This is important for obtaining reflecting metal layers that are to be vapour-deposited onto the separating agent layer. Layers vapour-deposited by the PVD method exactly reproduce the structure of the underlying layer, because they do not have a levelling effect like that of layers applied in liquid form, the surface tension of which produces such an effect.

The present invention will be explained in greater detail by means of the following Examples, in which preferred embodiments are illustrated, with reference to the accompanying drawing.

FIG. 1 shows a test set-up for implementation of the method according to the invention. The arrangement according to FIG. 1 was found to be necessary because, in vaporisation tests using substances for which there is no data relating to their behaviour in a PVD method, it was to be expected that unknown cleavage substances would occur. The following list gives a description of the individual components of the testing system according to FIG. 1.

| | |
|---|---|
| Chamber | Vacuum chamber measuring 300 × 300 × 300 mm having an integral thermal vaporiser, controllable from 20 to 500° C., a liquid nitrogen trap for condensing cracked gases, valves, fitted electrical valves and also a vacuum-measuring device (not shown) |
| V1 | Pump valve |
| Vdr + D1.8 | Throttle valve, adjustable by means of the throttle port D1.8, for throttled pump operation during vaporisation (minimising the intake of cracking products into the vacuum pump) |

-continued

| | |
|---|---|
| Pressure switch | Safety indicator in the event of thermal decomposition of the separating agent under test or a pressure increase in the chamber of more than $1.1 \times 10^5$ Pa (triggering evacuation via the absorption column with simultaneous inlet of nitrogen into the chamber) |
| $VN_2$ | Nitrogen inlet valve for emergencies, that is to say a pressure of $> 1.1 \times 10^5$ Pa |
| S1 | Non-return valve; the line leads to the absorption column |
| D65B | 2-step rotary vane pump set comprising turbo pump; final vacuum better than $10^{-4}$ Pa without pre-filter or $10^{-3}$ with pre-filter |
| V10 | Absorption column by-pass valve for direct evacuation of the cold chamber |
| V11 | Passes evacuated gas through the absorption column when V10 is closed |
| V13 | Manual valve, supplying fresh absorption agent |
| V14 | Discharge of used absorption agent |

EXAMPLE 1

A selected separating agent, in an amount of 20 grams, was filled into a heatable crucible having an opening of 10×1 cm in the vacuum chamber according to FIG. 1. The crucible was indirectly heated by means of a metal grating arranged above it, made from chromium nickel 80Ni20Cr, in the direct flow path. A sample plate measuring 250×250×1 mm, as the condensation surface, was fastened to the roof of the chamber. The chamber was evacuated to $10^{-3}$ Pa and the metal grating was slowly heated electrically to a temperature 30° C. below the known melting point of the substance, thereby ensuring that only sublimative vaporisation was possible. During heating of the crucible by means of a controllable voltage source, vacuum measurement was carried out. If a collapse in the vacuum to more than 1 Pa was observed, the temperature was lowered and, after 5 minutes, was again increased to 30° C. below the melting point. By that means it was possible to eliminate gas emission effects before the measurement. If the vacuum again collapsed to more than $10^{-1}$ Pa, the conclusion had to be drawn that decomposition was present to a greater or lesser extent. After each test, the chamber was purged with nitrogen, and the sample plate was removed and weighed. The vapour-deposition rate could be calculated from the increase in weight and the vaporisation time. In order for a separating agent to be used economically in an industrial method, it should satisfy the following condition at a sublimation temperature of 30° C. below the melting point:

$$1/A * dm/dt \geq 0.15 \text{ g min}^{-1} \text{ cm}^{-1}$$

wherein:
A is the area from which vaporisation takes place (cm²) and dm/dt is the vaporisation rate (g/sec).

Vaporisation from the liquid phase was to be avoided because of the risk of spatter and foam formation caused by cracked gases that form. The value of $dm/dt \geq 0.15$ g min$^{-1}$ cm$^{-1}$ corresponds approximately to the vaporisation rate from a conventional aluminium vaporiser at about 1450° C.

EXAMPLE 2

Under the same vacuum, a selected separating agent and, subsequently, a layer of aluminium were vapour-deposited onto a sample plate. The layer thicknesses were about 40 nm for the separating agent layer and about 45 nm for the aluminium layer. The condensation rate was adjusted to 20–30 nm/sec by means of the temperature of the vaporisation source. Lower condensation rates are of little interest because, in a continuous industrial process, they would result in unfeasibly slow carrier speeds. The measurement was carried out using a known technique by means of a quartz resonator, which was mounted at the same level as the sample plate in the middle thereof. For that purpose, a hole corresponding to the diameter of the measurement head was drilled through the middle of the sample plate, thereby ensuring that the layer on top of the vibrating quartz was the same as that on top of the sample plate. As a result of this testing step, it was possible to limit the number of separating agents that are suitable for use because, in the case of many organic substances, it was found that either they did not condense on the carrier surface in the form of an amorphous layer or they reacted with the aluminium vapour-deposited thereon, resulting in matt, milky and also, in many cases, yellow-coloured layers which, on analysis by ESCA using a known technique, were found to be aluminium carbides. An indication of thermal cracking of some substances was the formation of an odour, which was investigated after opening the vacuum chamber.

EXAMPLE 3

The apparatus consisted of an immersion bath, in which there was immersed the sample plate, which was weighed before and after dissolution. As a result, it was possible to determine the amount condensed. The separating agent layer and the vapour-deposited metal layer were dissolved away from the carrier whilst measuring the time taken for the metal layer to come away and break up into flakes. The solvents used in the test series were: isopropanol, ethyl acetate, butanol, ethanol, petroleum spirit, methyl isobutyl ketone and methyl ethyl ketone. Using this method, it was possible in each case to determine the fastest solvent for a particular separating agent.

Table I shows the results for the substances tested in Examples 1 to 3 with regard to their suitability as separating agents in the method according to the invention.

The vaporisation of polymers is known from the literature and is difficult to explain chemically. It is not possible for whole chains to vaporise. Rather they are broken down into fragments which, on a condensation surface under a high vacuum, immediately undergo partial re-polymerisation. IR spectroscopy and also further chemical testing shows that the condensate is not the same substance as was present in the vaporiser. The molecular weight of the condensate is generally 70–40% lower. When in the form of a thin layer of from 30 to 100 nm, polymers, which are generally insoluble in isopropanol, ethanol and petroleum spirit, nevertheless dissolve in such solvents under certain conditions.

Nevertheless, unlike the non-polymerisable separating agents according to the invention, polymers have been found to be generally unsuitable as will be further explained hereinbelow.

From the chemical substances listed under nos. 101 to 228 it was possible to select types suitable as separating agents that can be vaporised by the PVD method according to the invention. Some condense in crystalline form, depending on the temperature of the substrate, and give the metal layer condensed on top of them a satin-like appearance which, in the case of metal pigments, may even be desirable in some cases.

The disadvantages in using polymers are based on the fact that the polymers cannot be vaporised satisfactorily, that it is difficult to maintain a constant vaporisation rate, that the polymers can crack and result in substantial collapse of the vacuum, that the polymer layers cannot readily be dissolved (in some cases they dissolve unacceptably slowly), that carbonised residues form in the region of the vaporiser, sublimation is not possible and spatter formation may occur.

It was also found that separating agents that dissolve sufficiently rapidly between a carrier and a vapour-deposited metal layer are suitable for a continuous method for the production of plane-parallel platelets by the PVD method. Especially suitable are those substances marked "<5 sec." and "1" in Table I, which exhibit little thermal decomposition on vaporisation in vacuo and thereafter exhibit rapid solubility in organic solvents. Separating agents found to be especially suitable were aromatic compounds having at least one benzene ring. (In the case of industrial belt speeds for the carrier of about 200 metres per minute and a practicable dissolution zone of max. 30 metres, there is a maximum of 6 seconds available for the organic separating agent to be dissolved away. It is of course technically possible for the length of such a dissolution zone to be increased or for the dissolution to be assisted by means of mechanical aids.)

It is furthermore advantageous for the separating agent or agents to be brought into exclusive contact with a heat-resistant ceramic solid, for the latter to be admixed in the form of powder or granules, and for the mixture to be heated in vacuo up to the vaporisation temperature required for the separating agent. It has been found that, in the case of some separating agents according to the invention, chemical or catalytic decomposition can be substantially reduced by the lack of contact with hot metal surfaces.

This invention opens up the possibility of producing layers of metal, such as aluminium, iron, titanium, copper and others, vapour-deposited by the PVD method, in a continuous method operating in a closed circuit, with a dwell time of limited length in the dissolution zone.

To the person acquainted with the subject matter, it will be obvious and possible to use derivatives and mixtures of the substances mentioned in Table I as separating agents in order to obtain the desired successful outcome. There are, likewise, known variants of the PVD vaporisation technique in which two or more substances are vaporised from the same source or from two or more overlapping sources. It is furthermore possible for organic separating agents to be fed in continuously to the vaporisation source.

A further variant comprises applying a succession of separating agent, product layer, separating agent, product layer etc., one after another, from 4 or more vaporiser sources in one pass before they are subsequently all detached together by dissolution in one solvent.

TABLE I

| No. | Separating agent | Metal surface | Dissolution time* | Vaporisation time (note) | Vacuum collapse** (note) |
|---|---|---|---|---|---|
| 101 | polyamide (DELRIN ™) | glossy | >20 sec. | 270° C. (caustic odour in the vacuum chamber after opening) | 3 (unsuitable) |
| 102 | polystyrene | discoloured | >20 sec. | 240° C. (styrene odour) | 3 (unsuitable) |
| 103 | polyester (polyethylene terephthalate; PET) | glossy | >20 sec. | 305° C. (caustic odour) | 3 (unsuitable) |
| 104 | polycarbonate (PC) (LEXAN ™) | glossy | >20 sec. | 300° C. (slight odour) | 3 (unsuitable) |
| 105 | polymethacrylate (PMMA) | glossy | >20 sec. | 265° C. (caustic odour) | 3 (unsuitable) |
| 106 | polytetrafluoroethylene (PTFE) | satin-like | >50 sec. | 420° C. (acrid smell; discontinued) | 3 (unsuitable) |
| 107 | polyimide (Kapton ™) | discoloured | >50 sec. | 450° C. (odour of medium strength) | 2 (unsuitable) |
| 108 | poyvinylcarbazole CAS No. 25067-59-8 | glossy | >20 sec. | 240° C. (slight odour) | 2 (unsuitable) |
| 109 | parylene | glossy | no dissolution | 360° C. | 2 (expensive and unsuitable) |
| 201 | saccharin sodium salt CAS No. 82325-42-0 | yellow discoloration | <5 sec. | 190° C. | 2 |
| 202 | tetraphenylmethane CAS No. 630-76-2 | satin-like | <5 sec. | 255° C. | 1 (expensive) |
| 203 | triphenylmethanol CAS No. 76-84-6 | satin-like | <5 sec. | 135° C. | 1 (expensive) |
| 204 | phenolphthalein CAS No. 77-09-8 | glossy | 5–10 sec. | 230° C. | 2 |
| 205 | triphenylene CAS No. 217-59-4 | glossy | 5–10 sec. | 170° C. | 1 |
| 206 | acetamidophenol CAS No. 621-42-1 | matt | >10 sec. | 120° C. | 2 |
| 207 | acetylsalicylic acid CAS No. 50-78-2 | glossy | <5 sec. | 110° C. | 1 |
| 208 | camphoric anhydride CAS No. 13429-83-9 | glossy, slightly yellow | 5–10 sec. | 180° C. | 2 |
| 209 | phenothiazine CAS No. 92-84-2 | glossy | 5–10 sec. | 160° C. | 1 |

TABLE I-continued

| | | | | | |
|---|---|---|---|---|---|
| 210 | anthracene CAS No. 120-12-7 | glossy | 5–10 sec. | 120° C. | 3 |
| 211 | anthraquinone CAS No. 84-65-1 | glossy | 5–10 sec. | 250° C. | 2 |
| 212 | mixture of 201 and 205 | matt yellow | 5–10 sec. | 170° C. | 2 |
| 213 | benzimidazole CAS No. 51-17-2 | matt | 5–10 sec. | 140° C. | 2 |
| 214 | benzene-1,2,4-tricarboxylic acid CAS No. 528-44-9 | yellowish | <5 sec. | 210° C. | 1 |
| 215 | biphenyl-2,2-dicarboxylic acid CAS No. 482-05-3 | glossy | <5 sec. | 190° C. | 1 |
| 216 | bis(4-hydroxyphenyl)sulfone CAS No. 80-09-1 | yellowish | 5–10 sec. | (substantial decomposition) | 3 |
| 217 | dihydroxyanthraquinone CAS No. 81-64-1 | matt | 5–10 sec. | 160° C. | 3 |
| 218 | hydantoin CAS No. 461-72-3 | glossy | 5–10 sec. | 190° C. | 2 |
| 219 | 3-hydroxybenzoic acid CAS No. 99-96-7 | yellowish | <5 sec. | 170° C. | 3 |
| 220 | 8-hydroxyquinoline-5-sulfonic acid monohydrate CAS No. 84-88-8 | yellowish | 5–10 sec. | 280° C. | 3 |
| 221 | 4-hydroxycoumarin CAS No. 1076-38-6 | glossy | 5–10 sec. | 180° C. | 2 |
| 222 | 7-hydroxycoumarin CAS No. 93-35-6 | glossy | 5–10 sec. | 180° C. | 2 |
| 223 | 3-hydroxynaphthalene-2-carboxylic acid CAS No. 86-48-6 | glossy | 5–10 sec. | 170° C. | 3 |
| 224 | isophthalic acid CAS No. 121-91-5 | glossy | 5–10 sec. | 270° C. | 2 |
| 225 | 4,4-methylene-bis-3-hydroxynaphthalene-2-carboxylic acid CAS No. 130-85-8 | matt | 5–10 sec. | 250° C. | 2 |
| 226 | naphthalene-1,8-dicarboxylic anhydride CAS No. 81-84-5 | glossy | <5 sec. | 220° C. | 1 |
| 227 | phthalimide CAS No. 85-41-6 | glossy | <5 sec. | 190° C. | 2 |

*relative time under identical test conditions by means of immersion at 25° C. in the fastest-acting solvent selected from the group consisting of isopropanol, ethyl acetate, ethanol, petroleum spirit, methyl isobutyl ketone and methyl ethyl ketone
**a pressure increase [Pa] of up to: $7 \times 10^{-2}$ $2 \times 10^{-1}$ $>2 \times 10^{-1}$
corresponds to a rating of 1: slight  2: moderate  3: substantial
This increase is dependent upon the test apparatus used and the installed suction power of the vacuum pumps. It is given here as a reference value.

The plane-parallel platelets produced by the method according to the invention have further advantages compared to pigments according to the prior art, especially in respect of their further processibility.

Metal pigments of aluminium according to the prior art already being further coated on a large industrial scale by a CVD method all originate from grinding processes, which are carried out in ball mills with the addition of test petroleum spirit and stearates. The removal of such residual layers is laborious, is not entirely possible and requires several washing procedures using clean solvent in a cascade arrangement. An example which uses ground aluminium as basic material is described in EP 0 708 154 (Schmid and Mronga). As a result of CVD coating with $SiO_2$ and an absorbing layer, an interference pigment is produced.

Removal of organic protective layers by vaporisation in the case of semi-conductor applications is described in DE 199 35 181 C2 (Moosheimer). These layers are also referred to as masks which can be removed by vaporisation.

According to the prior art, inorganic salts are vapour-deposited, for example according to U.S. Pat. No. 3,123,489 (Bolomey et al.), as separating agents for producing layers of zinc sulfide, fluorides or oxides. U.S. Pat. No. 6,270,840 (Weinert) uses likewise vapour-deposited salt layers as separating agents in a continuous method, in which all steps take place at the same time in vacuo. Although, in water, salts dissolve away from the surfaces of the plane-parallel platelets completely, they have the disadvantage that, in the case of platelets produced from copper, silver or tin, which can be used as conductive surface-coatings, they result in rapid chemical corrosion of those metals in the dissolution bath of water, especially because the vaporised salts, once dissolved, give rise to anions.

Compared to the prior art of the coating of plastics films, subsequent vapour-deposition of metal layers or combinations of metal, oxide or fluoride layers by the PVD method (for example, chromium, silicon oxide or magnesium fluoride) and dissolution of the coating layer in an organic solvent to produce plane-parallel platelets of such materials, use of the separating agents according to the invention has the substantial advantage that they do not leave behind polymers or oligomers attached to the product layers. Rather, they leave behind the separating agents in a monomolecular layer.

In contrast, polymers attached to the surfaces of plane-parallel platelets, whose metal layer is typically only 40 nm thick, form deposits of about from 10 to 15 nm twice, that is to say from 50 to 75% by volume. Because of their substantially smaller molecule size, the separating agent layers according to the invention leave behind residues of only about from 10 to 15% by volume.

Usually the plane-parallel platelets produced by the method according to the invention are immediately further processed in the form of the suspension that is obtained. It is, however, also possible for the plane-parallel platelets produced by the method according to the invention to be further cleaned.

In a subsequent step, the remaining monomolecular layers can be removed so that no residues remain, by vaporising them off from the produced plane-parallel platelets under a vacuum of from $10^{-3}$ to 10 Pa so that substantially no residues remain. The separating agent vaporised off is deposited as a solid on cold condenser surfaces and removed. The vaporisation temperatures during the procedure are lower than 350° C., preferably lower than 300° C.

Plane-parallel metallic platelets cleaned in that manner, without electrically insulating layers on their surfaces, are suitable, for example, for producing conductive surface-coating compositions, that is to say electrically conductive dispersions. By virtue of their small particle size, however, such platelets are also suitable for application processes by means of inkjet printing, intaglio printing and flexographic printing. Also, establishing contact with connection sites on electronic components or photovoltaic components is substantially simplified as a result.

This procedure would not be possible if adhering oligomers or polymers were present; they would undergo thermal decomposition and their cracking products would result in substantial discoloration of the plane-parallel platelets. As a result, the metallic appearance and the electrical conductivity would, at least in part, be lost.

The phrase "so that no residues remain", which is used above, is defined herein to mean that a cohesive monomolecular layer of the organic separating agent is no longer present on the surface. This requires the average theoretical layer thickness of contaminants caused by separating agent to be less than about 0.5 nm, corresponding to a "residue" of max. 0.6 mg per $m^2$ when the density of the separating agent is about 1.2 $g/cm^3$. The surfaces are then covered by non-cohesive islands only.

An example of a suitable measurement procedure comprises heating an amount of 100 g of dry aluminium platelets that are 40 nm thick, corresponding to a calculated surface area of 1000 $m^2$, to about 400° C. in a vacuum chamber which is heated on all sides, and measuring the pressure increase caused by the gaseous decomposition products. A comparison measurement of the pressure increase using 0.6 gram of the same separating agent on its own will give a calibration value. It is assumed in such a determination that the separating agents on which this invention is based will be thermally decomposed into gaseous components completely, without leaving behind cracking products, which is indeed the case.

Further processing of the resulting thermally cleaned plane-parallel platelets into printing inks, spray paints or dry powder coatings is therefore much more practicable. It is not necessary to take into account the chemical acceptability of organic residues because these, having been vaporised off, are no longer present to any appreciable extent.

The plane-parallel platelets produced by the PVD method and made available in the above manner so that they are free of organic residues and dry, can then be coated with other substances in a further step carried out after comminution and grading of the platelets by size using methods known per se, without organic residual layers having an adverse effect on the further coating.

Examples of such substances used for modification of surfaces are known under the trade names DYNASYLAN™, HYDROSIL™ and PROTECTOSIL™. As a result, hydrophilic or hydrophobic properties of surfaces or coupling layers comprising silane oligomers for the attachment of other organic substances are obtained.

It is also possible for such plane-parallel platelets of metals such as, for example, aluminium, silver or copper produced in the above manner by the PVD method and free of troublesome organic residues to be subjected to subsequent CVD treatment in a further procedure.

For that purpose, the plane-parallel platelets are exposed to a flow of a layer-forming gas at temperatures of more than 150° C. in a gas-tight container. Such known CVD methods would be impossible, or substantially more difficult, if organic residues of coating polymers were still to adhere to the platelets produced by the PVD method, as would be the case with the described methods according to the prior art. The attempt to remove such substances by vaporisation would result in firmly adhering cracking products remaining behind.

It is furthermore advantageous for the resulting cleaned metal surfaces of plane-parallel platelets produced by the PVD method to be coated with organic dyes—either directly or by means of a prior wet-chemical application of a coupling layer from 30 to 100 nm thick using methods known per se.

Such dyes, for example phthalocyanine, benzimidazolones such as NOVOPERM®, CROMOPHTAL®, GRAPHTOL®, diketopyrrolopyrroles (DPP) and isoindolines having the trade names PALIOTOL® and also perylene pigments, have sufficient thermal stability to be vapour-deposited under a vacuum of from 1 to $10^{-2}$ Pa onto cleaned, plane-parallel platelets produced by the PVD method.

In the process, the metal platelets in the form of loose material are continuously agitated in a manner known per se until they are encased in a thin layer of those organic materials and also exhibit a pastel colour of greater or lesser intensity depending upon the thickness of the layer applied. The layers produced in that manner also serve as chemical protective layers when such products are used in surface-coating compositions comprising aqueous solvents.

The double function of such encased plane-parallel platelets is that of a coloured reflector and also, when aluminium is used as platelet material, protection thereof against the known evolution of hydrogen caused by reaction of water with aluminium. By that means, unacceptable bubble formation in the surface-coating layer at drying temperatures of 50° C. and above is avoided. The double function achieved makes up for the disadvantage that the coating step requires its own apparatus and, after removal of the separating agent residues by vaporisation has been performed, has to be carried out as a final step after mechanical comminution of the platelets.

The Examples that follow are intended to further describe the use of the organic separating agents described herein.

EXAMPLE 4

Production of plane-parallel platelets of aluminium, without further treatment, that is to say with a residue of about 5% by weight of separating agent on the platelets.

| | |
|---|---|
| Step 1 | Vapour-deposition of a 30 nm layer of phenolphthalein on an endless belt carrier by the method according to U.S. Pat. No. 6 270 840 at a vaporisation temperature of 300° C. and under a vacuum of $10^{-2}$ Pa. |
| Step 2 | Under the same vacuum and in the same pass: vapour-deposition of an aluminium layer 40 nm thick. |
| Step 3 | After passing through 2 air-lock stages into a vacuum chamber of 5000 Pa: the double layer on the running belt is exposed to isopropyl alcohol. The aluminium layer breaks up into fine flakes and comes away from the belt. The suspension is collected in vacuo. |
| Step 4 | The suspension is discharged from the vacuum chamber, and the suspension is concentrated to a solids content of 25% by centrifugation. The procedure is repeated 3 times using fresh isopropyl alcohol. |
| Step 5 | Further processing by means of comminution and grading, before being processed to form a surface-coating composition. |

EXAMPLE 5

Production of surface-cleaned plane-parallel platelets of silver

| | |
|---|---|
| Step 1 | Vapour-deposition of a 30 nm layer of phenolphthalein on an endless belt carrier by the method according to U.S. Pat. No. 6 270 840 at a vaporisation temperature of 300° C. and under a vacuum of $10^{-2}$ Pa. |
| Step 2 | Under the same vacuum and in the same pass: vapour-deposition of a silver layer 90 nm thick. |
| Step 3 | After passing through 2 air-lock stages into a vacuum chamber of 5000 Pa: the double layer on the running belt is exposed to isopropyl alcohol. The silver layer breaks up into fine flakes and comes away from the belt. The suspension is collected in vacuo. |
| Step 4 | 5 kg of the suspension, consisting of 10% silver, 1% dissolved phenolphthalein and 89% isopropyl alcohol, is discharged from the vacuum chamber, and the suspension is concentrated to a solids content of 50% by centrifugation. |
| Step 5 | Comminution of the silver particles in suspension by means of ultrasound, separation of particle sizes by means of sedimentation. |
| Step 6 | Introduction of the suspension into a second vacuum apparatus and concentration by evaporation at 5000 Pa and a temperature rising from 25 to 60° C. |
| Step 7 | Further heating of the suspension in the same vacuum apparatus; the wall temperature is increased to 300° C., with simultaneous recirculation and precipitation of the vaporised phenolphthalein on a cold condenser surface at a temperature of from −196° C. to +25° C. |
| Step 8 | The resulting dry silver platelets freed from contaminants on their surfaces are discharged for further processing to form an electrically conductive surface-coating composition. |

EXAMPLE 6

Production of plane-parallel copper platelets having a clean surface with subsequent coating on all sides with a silane oligomer. Steps 1 to 7 are identical to those of Example 5; instead of silver, copper is used.

| | |
|---|---|
| Step 8 | 500 g of the copper platelets, cooled to about room temperature, are dispersed under normal pressure in a bath of 10 litres of isopropyl alcohol containing 100 g of silane oligomer DYNASYLAN ® Ameo (CAS No. 919-30-2*) dissolved therein. 0.55 litre of water is added at 25° C. After about 20 minutes, a hydrophilic, transparent layer of from 20 to 30 nm is deposited in the intensively agitated bath. |
| Step 9 | The suspension is filtered and the coated platelets are dried at 100° C. in the air stream of a fluidised bed. |
| Step 10 | The dry product is suitable for use as a pigment in decorative copper-tone surface-coating compositions. In surface-coating compositions, the product does not float on the surface. |

*: Manufacturer: Degussa-Hüls AG, Rheinfelden works

In general, greater addition of water results in a greater amount of hydrolysis and more rapid but non-uniform coating. In the case of aluminium, transfer of the produced plane-parallel platelets into the bath should be carried out under a protective gas because of the reactivity of the aluminium.

Organic dyes can be vapour-deposited by the PVD method on the plane-parallel platelets obtained after Step 10.

I claim:

1. A method for the production of plane-parallel platelets, comprising the steps:
    a) vapour-deposition, at a pressure below atmospheric pressure, of a separating agent onto a carrier to produce a separating agent layer,
    b) vapour-deposition, at a pressure below atmospheric pressure, of at least one product layer onto the separating agent layer, and
    c) dissolution of the separating agent layer in a solvent and production of a suspension in which the at least one product layer is present in the form of plane-parallel platelets,
    in which method the separating agent is selected from the group consisting of anthracene, anthraquinone, acetamidophenol, acetylsalicylic acid, camphoric anhydride, benzimidazole, benzene-1,2,4-tricarboxylic acid, biphenyl-2,2-dicarboxylic acid, bis(4-hydroxyphenyl)sulfone, dihydroxyanthraquinone, hydantoin, 3-hydroxybenzoic acid, 8-hydroxyquinoline-5-sulfonic acid monohydrate, 4-hydroxycoumarin, 7-hydroxycoumarin, 3-hydroxynaphthalene-2-carboxylic acid, isophthalic acid, 4,4-methylene-bis-3-hydroxynaphthalene-2-carboxylic acid, naphthalene-1 , 8-dicarboxylic anhydride, phthalimide, potassium salt of phthalimide, phenolphthalein, phenothiazine, saccharin, salts of saccharin, tetraphenylmethane, triphenylene, triphenylmethanol, and mixtures thereof.

2. A method according to claim 1, wherein the product layer encompasses aluminium, iron, copper, silver, zinc, tin, titanium, or mixtures thereof.

3. A method according to claim 1, wherein the pressure in steps a) and b) is in the range from $10^{-3}$ to 0.5 Pa and in step c) is in the range from 10 to $2\times10^5$ Pa.

4. A method according claim 1, wherein the solvent encompasses isopropanol, ethyl acetate, butanol, ethanol, petroleum spirit, methyl isobutyl ketone, methyl ethyl ketone, perchloroethylene, or mixtures thereof.

5. A method according to claim 1, wherein the separating agent is vaporised from a mixture comprising a ceramic material in granule or powder form, the ceramic material remaining unvaporised as a residue.

6. A method according to claim 1, wherein the separating agent is vaporised from a crucible having a ceramic or glass surface or a quartz surface.

7. A method according to claim 1, wherein the separating agent is fed in to the vaporisation source, in vacuo, continuously or at time intervals.

8. A method according to claim 1, wherein, before the separating agent layer is dissolved, there is vapour-deposited a combination of layers consisting of more than two layers, a further separating agent layer being located between every two product layers.

9. A method according to claim 1, wherein the separating agent layer has a thickness of from about 10 nm to about 200 nm and the product layer has a thickness of from about 10 nm to about 500 nm.

10. A method according to claim 1, comprising the following further step:
   d) removal of separating agent residues by vaporisation at up to 350° C. and under a vacuum of from 10 to $10^{-3}$ Pa.

11. A method according to claim 10, comprising the following further step:
   e) application of hydrophobic layers, hydrophilic layers or coupling layers comprising silane oligomers to the cleaned surfaces—produced by vaporisation in step d)—of the plane-parallel platelets.

12. A method according to claim 10, comprising the further step of simultaneous agitation of loose material obtained in step d) along with vapour-deposition of organic dyes by a physical vapor deposition method.

13. A method according to claim 11, comprising the further step of subjecting agitated loose material obtained in step a) to vapour-deposition of organic dyes by a physical vapor deposition method.

* * * * *